(12) United States Patent
Major et al.

(10) Patent No.: US 9,052,606 B2
(45) Date of Patent: Jun. 9, 2015

(54) MICROLITHOGRAPHIC PROJECTION EXPOSURE APPARATUS

(71) Applicant: Carl Zeiss SMT GmbH, Oberkochen (DE)

(72) Inventors: Andras G. Major, Oberkochen (DE); Manfred Maul, Aalen (DE); Gundula Weiss, Aalen (DE); Jochen Hetzler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 304 days.

(21) Appl. No.: 13/627,842

(22) Filed: Sep. 26, 2012

(65) Prior Publication Data

US 2013/0077074 A1    Mar. 28, 2013

(30) Foreign Application Priority Data

Sep. 27, 2011   (DE) .......................... 10 2011 083 559

(51) Int. Cl.
| | |
|---|---|
| G03B 27/32 | (2006.01) |
| G03B 27/52 | (2006.01) |
| G03B 27/54 | (2006.01) |
| G03B 27/72 | (2006.01) |
| G03F 7/20 | (2006.01) |

(52) U.S. Cl.
CPC ........ G03F 7/70158 (2013.01); G03F 7/70116 (2013.01); G03F 7/70891 (2013.01); G03F 7/70575 (2013.01); G03F 7/70883 (2013.01)

(58) Field of Classification Search
CPC ............ G03F 7/70116; G03F 7/70158; G03F 7/70575; G03F 7/70883; G03F 7/70891
USPC .......................................... 355/30, 67, 71, 77
See application file for complete search history.

(56) References Cited

U.S. PATENT DOCUMENTS

| | | | | |
|---|---|---|---|---|
| 4,338,821 | A | * | 7/1982 | Dion ................................ 73/603 |
| 7,477,355 | B2 | | 1/2009 | Fehr et al. |
| 7,557,902 | B2 | | 7/2009 | Dinger et al. |
| 2004/0145744 | A1 | * | 7/2004 | Dobschal et al. ............. 356/446 |
| 2008/0212045 | A1 | * | 9/2008 | Bader .............................. 355/30 |
| 2009/0002667 | A1 | * | 1/2009 | Sekine ............................ 355/67 |
| 2009/0091730 | A1 | * | 4/2009 | Tanaka ............................ 355/67 |
| 2010/0290020 | A1 | * | 11/2010 | Mori ............................... 355/67 |

FOREIGN PATENT DOCUMENTS

| | | | |
|---|---|---|---|
| DE | 103 17 662 | 11/2004 | |
| WO | WO 2004/092843 | 10/2004 | |
| WO | WO 2009080279 A1 * | 7/2009 | ................ G03F 7/20 |

* cited by examiner

*Primary Examiner* — Colin Kreutzer
(74) *Attorney, Agent, or Firm* — Fish & Richardson P.C.

(57) ABSTRACT

A microlithographic projection exposure apparatus includes a projection light source. The apparatus also includes a heating light source for generating heating light which is at least partly absorbed by an optical element. An illumination optical unit directs the heating light onto the optical element such that the heating light has a predefined intensity distribution on an optical surface of the optical element. The illumination optical unit includes a deflection element which is a diffractive optical element or a refractive freeform element. The deflection element simultaneously directs the heating light impinging thereon in different directions.

19 Claims, 7 Drawing Sheets

MICROLITHOGRAPHIC PROJECTION EXPOSURE APPARATUS

CROSS REFERENCE TO RELATED APPLICATIONS

This application claims priority under 35 U.S.C. §119 to German Application No. 10 2011 083 559.8 filed Sep. 27, 2011, the entire contents of which are incorporated by reference herein.

FIELD

The disclosure relates to a microlithographic projection exposure apparatus for imaging a mask onto a layer.

BACKGROUND

Microlithographic projection exposure apparatuses are used to transfer structures contained in a mask or arranged thereon to a photoresist or some other light-sensitive layer. Important optical components of a projection exposure apparatus are a light source, an illumination system which conditions projection light generated by the light source and directs it onto the mask, and a projection objective which images that section of the mask which is illuminated by the illumination system onto the light-sensitive layer.

The shorter the wavelength of the projection light, the smaller the structures that can be defined on the light-sensitive layer with the aid of the projection exposure apparatus. The next generation of projection exposure apparatuses will use projection light in the extreme ultraviolet spectral range (EUV), having a wavelength of 13.5 nm. Such apparatuses are often referred to as EUV projection exposure apparatuses.

However, there are no optical materials which have a sufficiently high transmittance for such short wavelengths. Therefore, in EUV projection exposure apparatuses the lenses and other refractive optical elements that are customary at longer wavelengths are replaced by mirrors, and the mask, too, therefore also contains a pattern of reflective structures.

Providing mirrors for EUV projection exposure apparatuses constitutes a major technological challenge. Coatings which are suitable for EUV light and are applied to a mirror substrate often include more than 30 or 40 double layers having a thickness of just a few nanometers which are vapour-deposited one above another in technologically complex processes. Even with coatings having such a complex construction, the reflectivity of the mirrors for the EUV light is usually hardly more than 70%, and even this applies only to light which impinges on the reflective coating perpendicularly or at angles of incidence of a few degrees.

The consequence of the comparatively low reflectivity of the mirrors is that during the development of projection exposure apparatuses an effort has to be made to use as few mirrors as possible, since each mirror is associated with losses of light and ultimately reduces the throughput of the projection exposure apparatus.

However, the relatively low reflectivity of the mirrors is also accompanied by thermal problems, since that portion of the high-energy EUV light which is not reflected by the coating is absorbed and leads to a temperature increase in the mirrors. The heat generated in the process has to be dissipated substantially by way of thermal conduction via the mirror substrate, since projection exposure apparatuses have to be operated in a vacuum owing to the high absorption of EUV light by gases and heat transfer by convection is therefore ruled out.

In order that temperature gradients occurring in the mirror substrates do not lead to an undesired deformation of the mirrors, it is expedient to use materials for the mirror substrates which have a coefficient of thermal expansion that is as small as possible or even vanishingly small at the operating temperature. Glass-based materials of this type are sold for example by Schott under the trade name Zerodur® and by Corning under the trade name ULE®. By using additional measures, thermal deformations caused by absorption of EUV light can be kept small or at least the effects thereof on the optical properties of the projection objective can be kept within tolerable limits.

U.S. Pat. No. 7,477,355 B2 proposes heating mirrors with the aid of an additional heating mechanism such that the substrate material of the mirrors is at a temperature at which the coefficient of thermal expansion is zero or at least minimal. Temperature fluctuations during the operation of the apparatus then have no effect, or only a small effect, on the imaging properties of the mirror.

U.S. Pat. No. 7,557,902 B2 describes a projection objective in which two mirrors are formed of materials whose coefficient of thermal expansion increases with increasing temperature in one of the two mirrors and decreases with increasing temperature in the other mirror. By selecting suitable mirrors, although the two mirrors deform significantly in the case of a temperature change, the optical effects of these deformations largely cancel one another out.

Similar issues also are to be addressed in the case of facet mirrors, except that in that case generally a carrying body that carries the individual mirror facets is affected by thermally induced deformations. Owing to the comparatively low thermal conductivity of glass-based materials, metals are usually used as carrying body. However, in general, there are no metals which have at an operating temperature a coefficient of thermal expansion having a low magnitude similar to that in the case of the glass-based materials mentioned above.

Thermally induced deformations also exist in projection exposure apparatuses designed for longer wavelengths, e.g. 193 nm (VUV) or 254 nm (DUV). This usually affects lens elements and other refractive optical elements which heat up inhomogeneously as a result of (albeit slight) absorption of projection light and change their form as a result.

DE 103 17 662 A1 discloses an EUV projection exposure apparatus including a heating light source, which illuminates selected regions on imaging mirrors with additional heating light. As a result of absorption of the heating light, an at least approximately homogeneous temperature distribution is established on the surface of the mirror. With a suitable design it can be achieved that at thermal equilibrium a temperature is established at which the coefficient of thermal expansion of the mirror substrate has an absolute value minimum. As a result, generally, relatively small temperature fluctuations or residual inhomogeneities of the temperature distribution can no longer lead to appreciable thermal deformations of the mirror substrate and thus to imaging aberrations.

In order to illuminate only selected regions on the mirror with the heating light, a transmission filter is arranged downstream of the heating light source in this known projection exposure apparatus, the transmission filter shading those regions on the mirror surface on which projection light impinges and which are therefore intended not to be additionally heated by heating light. If the heating light is intended to form a pattern that is as sharply delimited as possible on the mirror surface, an additional imaging optical unit can be provided, which images the transmission filter onto the mirror surface. In another embodiment, a laser is used as heating light, a controllable ray deflecting device being assigned to the laser. By use of the ray deflecting device, the laser ray generated by the laser is directed only onto the desired regions on the mirror surface. In this case, the ray deflecting device can be embodied in a manner similar to that in barcode scanners known per se.

However, when a transmission filter is used, under certain conditions not insignificant, a portion of the heating light is lost in the transmission filter. If only relatively small regions are intended to be heated with high intensity on the mirror surface, then the use of transmission filters usually involves very powerful heating light sources, as a result of which the transmission filter heats up to an even greater extent.

With the use of a relatively fine laser ray which, in a scanner-like mirror, sweeps over the regions on the mirror surface which are to be illuminated by the heating light, then generally no loss of light occurs. However, the intensity of the laser ray is high in order to achieve a sufficiently high heat input, and the sensitive reflective coating of the mirrors can be damaged by high local radiation action under certain circumstances.

SUMMARY

The disclosure seeks to provide a microlithographic projection exposure apparatus which simultaneously exhibits efficient and gentle heating of optical elements with heating light.

In one aspect, the disclosure provides a microlithographic projection exposure apparatus for imaging a mask onto a layer. The apparatus includes a projection light source configured to generate projection light to which the layer is light-sensitive, and an optical element having an optical surface subjected to the projection light during the operation of the apparatus. The apparatus further includes a heating light source, which differs from the projection light source and which is configured to generate heating light, to which the layer is not light-sensitive and which is at least partly absorbed by the optical element. The apparatus also includes an illumination optical unit, which is configured to direct the heating light onto the optical element such that on the optical surface the heating light has a predefined intensity distribution. The illumination optical unit includes a deflection element formed by a diffractive optical element or as a refractive freeform element, wherein the deflection element directs the heating light impinging thereon simultaneously in different directions.

Instead of shading light which leaves the illumination optical unit in undesirable directions with the aid of a transmission filter or, as in the case of a scanning laser ray, directing the heating light temporally successively to different locations, according to the disclosure a deflection element is used which distributes the heating light simultaneously among the different directions such that the desired intensity distribution is generated on the optical surface of the optical element to be heated. As a result, high heating powers can be transferred with low losses from the heating light source to the optical element. The heat loss arising in the projection exposure apparatus is correspondingly low; moreover, very high local radiation intensities which can lead to damage to sensitive surfaces of the optical element are avoided.

If different intensity distributions are intended to be able to be generated on the optical surface of the optical element, then the deflection element has variable optical properties.

In the simplest case, the deflection element is accommodated in an exchangeable holder, such that it can be exchanged for a different deflection element having different deflection properties.

The use of a deflection element having controllably variable deflection properties is even more flexible.

When the deflection element is designed as a diffractive optical element, an appropriate option, for example, is to design the diffractive optical element as an LCD panel which is switchable in a spatially resolved manner. The diffractive structures of the diffractive optical element are then formed by pixels of the LCD panel which can be individually switched on and off. A variable angular distribution of the deflection element and thus on the optical surface a variable intensity distribution of the heating light can be established in this way.

Another example of a diffractive deflection element having controllably variable deflection properties is an acousto-optical modulator. In such a modulator, ultrasonic standing waves are generated with the aid of an ultrasonic generator. The waves lead to the formation of grating-like refractive index distributions having a diffractive effect which can be varied by the driving the ultrasonic generator.

In particular for a fine correction of the intensity distribution on the optical surface, the illumination optical unit may include an LCD panel which is switchable in a spatially resolved manner and by which parts of the heating light can be attenuated in a controllable manner. Although absorption losses arise as a result of such a controllably variable transmission filter, they can be kept low if the illumination of the optical surface on the optical element is substantially determined by the deflection element and the LCD panel is used only for relatively small corrections.

In one embodiment of the disclosure, the illumination optical unit includes a telescope optical unit arranged downstream of the deflection element in the beam path. Such a telescope optical unit has the advantage that it magnifies the angular distribution prevailing on the input side. Primarily when the deflection element is designed as a diffractive optical element, this considerably reduces the demands made of the diffractive optical element, since small deflection angles can be produced by comparatively large diffractive structures. This in turn facilitates the production of the diffractive optical element. If the telescope optical unit has a magnification of 10, for example, then, at a wavelength of the heating light of 1 µm, grating periods of 20 µm suffice in order to generate deflection angles of 30° at the output of the of the telescope optical unit. The diffractive optical element, by contrast, merely has to produce deflection angles of around 3°.

The disclosure can be used particularly advantageously if the optical element is a mirror and the projection light has a wavelength of less than 30 nm. In principle, however, the disclosure can also be used in the case of mirrors and refractive elements in VUV or DUV projection exposure apparatuses.

The heating light may be, for example, infrared light having a centre wavelength of between 0.8 µm and 50 µm. Infrared light is generally absorbed to a great extent by the optical elements to be heated. Moreover, the photoresists usually used as a light-sensitive layer are generally not light-sensitive to infrared light. This is important because it may not be possible to prevent that small amounts of heating light reach the photoresist as a result of reflection or scattering.

An exit window can be assigned to the heating light source, wherein heating light emerges from the exit window during the operation of the apparatus. The illumination optical unit then preferably includes a collimator, which converts the light emerging from the exit window into a collimated beam. The use of collimated light firstly facilitates the design of the deflection element. Moreover, as a result, the angular distribution downstream of the deflection element becomes largely independent of the intensity distribution of the heating light to which the deflection element is subjected.

The exit window can be, for example, the exit window of the heating light source itself, e.g. of an infrared laser diode. However, the exit window can also be formed by the end of an optical fibre that guides the heating light from the heating light source to the illumination optical unit.

BRIEF DESCRIPTION OF THE DRAWINGS

Further features and advantages of the disclosure will become apparent from the following description of embodiments with reference to the drawings, in which.

DESCRIPTION OF THE PREFERRED EMBODIMENTS

1. Basic Construction of the Projection Exposure Apparatus

Figure 1:
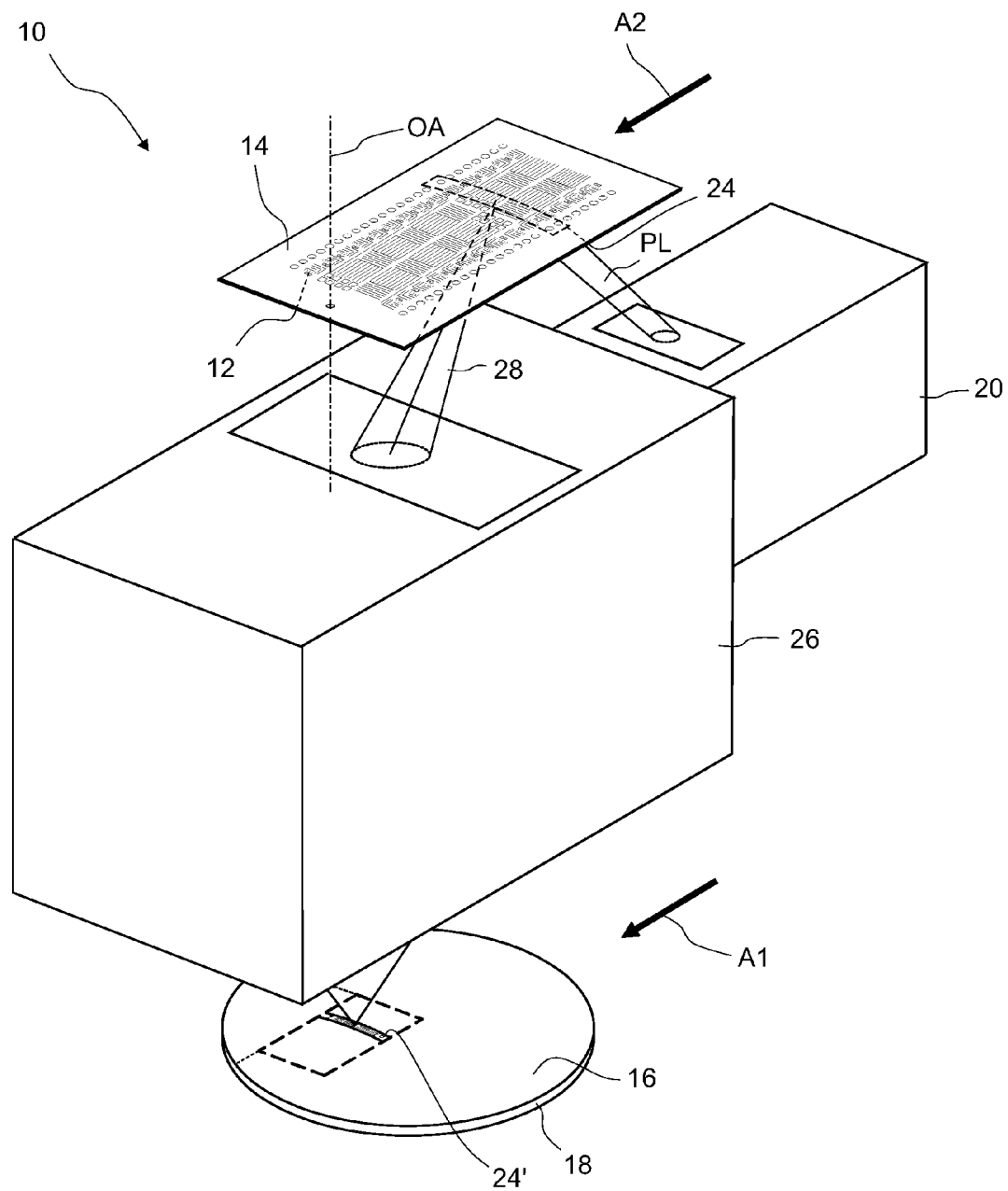
FIG. 1 is a schematic perspective view of an EUV-projection exposure apparatus according to the disclosure in accordance with a first embodiment.

FIG. 1 shows, in a perspective and highly schematic illustration, the basic construction of a microlithographic projection exposure apparatus according to the disclosure, the apparatus being designated in its entirety by 10. The projection exposure apparatus 10 serves to project reflective structures 12 arranged on the underside of a mask 14 onto a light-sensitive layer 16. The light-sensitive layer 16, which can be, in particular, a photoresist (also called resist), is carried by a wafer 18 or some other substrate.

The projection exposure apparatus 10 includes an illumination system 20, which illuminates that side of the mask 14 which is provided with the structures 12 with projection light PL. A range of between 5 nm and 30 nm, in particular, is appropriate as wavelength for the projection light PL. In the present embodiment illustrated, the centre wavelength of the projection light PL is approximately 13.5 nm and is therefore in the extreme ultraviolet spectral range (EUV). The projection light PL illuminates an illumination field 24 on the underside of the mask 14, the illumination field having the geometry of a ring segment in the embodiment illustrated.

The projection exposure apparatus 10 furthermore includes a projection objective 26, which generates on the light-sensitive layer 16 a reduced image 24' of the structures 12 lying in the region of the illumination field 24. OA designates the optical axis of the projection objective 26, which coincides with the axis of symmetry of the ring-segment-shaped illumination field 24. However, the disclosure can also be used in those projection exposure apparatuses in which no rotationally symmetrical sector surfaces are present in the projection objective 26 and, therefore, an optical axis is not defined.

The projection objective 26 is designed for scanning operation in which the mask 14 is displaced synchronously with the wafer 18 during the exposure of the light-sensitive layer 16. These displacing movements of the mask 14 and of the wafer 18 are indicated by arrows A1, A2 in FIG. 1. The ratio of the speeds at which the mask 14 and the wafer 18 are displaced is in this case equal to the imaging scale $\beta$ of the projection objective 26. In the embodiment illustrated, the image 24' generated by the projection objective 20 is reduced ($|\beta|<1$) and erect ($\beta=0$), for which reason the wafer 18 is displaced more slowly than the mask 14, but in the same direction. During an exposure of the light-sensitive layer 16, the illumination field 24 thus sweeps over the mask 14 in a scanner-like manner, as a result of which even relatively large contiguous structure regions can be projected onto the light-sensitive layer 16.

Light beams proceed from each point in the illumination field 24 which is situated in an object plane of the projection objective 26, the light beams entering into the projection objective 26. The latter has the effect that the entering light beams converge in an image plane downstream of the projection objective 26 at field points. The field points in the object plane from which the light beams proceed, and the field points in the image plane in which the light beams converge again are in this case in a relationship with one another which is designated as optical conjugation.

For an individual point in the centre of the illumination field 24, such a light beam is indicated schematically and designated 28. In this case, the aperture angle of the light beam 28 upon entering into the projection objective 10 is a measure of the numerical aperture NA thereof. On account of the reduced imaging, the image-side numerical aperture NA of the projection objective 26 is enlarged by the reciprocal of the imaging scale β.

Figures 2, 3:
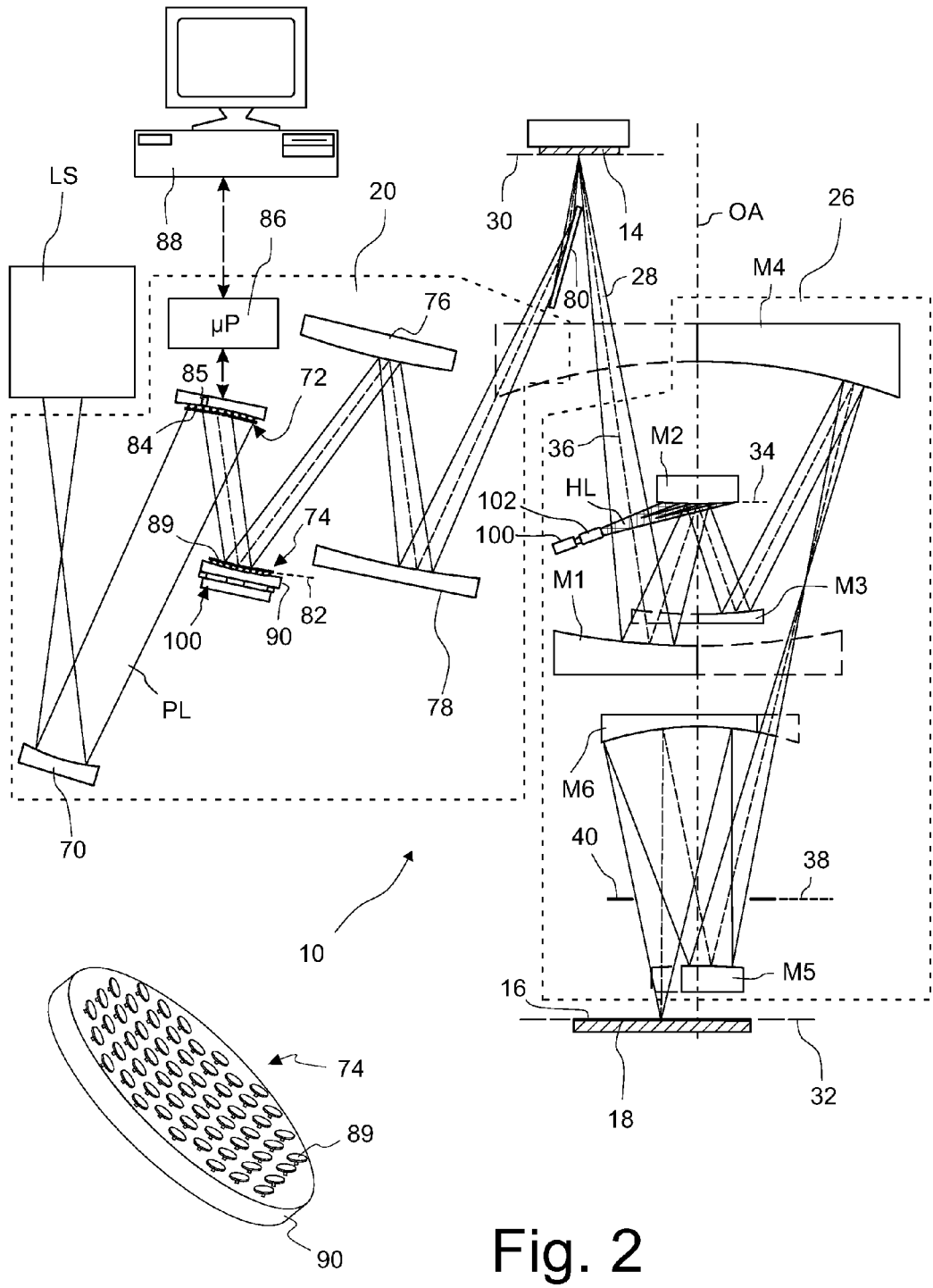
FIG. 2 is a meridional section through the projection exposure apparatus shown in FIG. 1.
FIG. 3 is a perspective simplified view of a pupil facet mirror that is part of an illumination system of the projection exposure apparatus shown in FIGS. 1 and 2.

FIG. 2 shows a schematic meridional section through the projection exposure apparatus 10. The projection objective 26 has an object plane 30 and an image plane 32, between which a total of six mirrors M1 to M6 are arranged. The light beam 28 proceeding from a point in the object plane 30 firstly impinges on a concave first mirror M1, is reflected back onto a convex second mirror M2, impinges on a concave third mirror M3, is reflected back onto a concave fourth mirror M4 and impinges on a convex fifth mirror M5, which directs the EUV light back onto a concave sixth mirror M6. The latter finally focuses the light beam 28 into a conjugate imaging point in the image plane 32.

If the mirrors M1 to M6 were supplemented by the parts indicated by dashed lines in FIG. 2, then the reflective surfaces of the mirrors thus supplemented would be rotationally symmetrical with respect to the optical axis OA of the projection objective 26. As can readily be discerned, the beam path described above could not be realized with such completely rotationally symmetrical mirrors, however, since the mirrors M1, M2 and M4 to M6 would then partly block the light path.

The projection objective 26 has a first pupil surface 34 which is situated in or in direct proximity to the surface of the second mirror M2. A pupil surface is distinguished by the fact that there the chief rays of the light beams proceeding from points in the object plane 30 intersect the optical axis OA. This is shown in FIG. 2 for the chief ray of the light beam 28, the chief ray being designated by 36 and indicated in a dashed fashion.

A second pupil surface 38 is situated in the beam path between the fifth mirror M5 and the sixth mirror M6, where the distance from the second pupil surface 38 to these two mirrors M5, M6 is relatively large. A shading diaphragm 40 is arranged at the level of the second pupil surface 38.

The illumination system 20 of the projection exposure apparatus 10 conditions the EUV light generated by a light source LS (e.g. a laser plasma source) and directs it onto the mask 14 so that there each point within the illumination field 24 is illuminated with EUV light having the desired intensity and illumination angle distribution. For this purpose, the illumination system 20 includes an input mirror 70, a field facet mirror 72, a pupil facet mirror 74, a first condenser mirror 76 and a second condenser mirror 78. Via a mirror 80 designed for grazing incidence, the EUV light is finally directed onto the mask 14.

The pupil facet mirror 74 illustrated in perspective view in FIG. 3 is in this case arranged in a pupil surface of the illumination system 20, the pupil surface being indicated at 82. The pupil surface 82 of the illumination system 20 is optically conjugate with respect to the pupil surfaces 34 and 38 of the projection objective 26. Consequently, the intensity distribution on the pupil facet mirror 74 of the illumination system 20 is imaged firstly onto the second mirror M2 of the projection objective 26 and from there onto the second pupil surface 38.

The pupil facet mirror 74 can be illuminated in different ways via the field facet mirror 72. For this purpose, the mirror facets 84 of the field facet mirror 72 are individually tiltable with the aid of actuators 85 or adjustable in some other way such that the EUV light impinging on them can be directed onto different mirror facets of the pupil facet mirror 74. For this purpose, the actuators 85 of the field facet mirror 72 are driven by a control unit 86, which is connected to a superordinate central controller 88 of the projection exposure apparatus 10. The geometry of the illumination field 24 in the object plane 30 is defined by the outer contour of the field mirror facets 84.

Since the pupil surface 82 of the illumination system 20 is linked to the object plane 30 by a Fourier transformation, the illumination angle distribution in the object plane 30 is defined by the spatial intensity distribution in the pupil surface 82. Consequently, via different illuminations of the pupil facet mirror 74, the illumination angle distribution of the projection light impinging on the mask 14 can be adapted in a targeted manner to the structures 12 contained in the mask 14.

In the case of some illumination angle distributions, projection light is intended to impinge on the mask only in a narrowly delimited angular range. For the illumination of the pupil surface 82 of the illumination system 20 this means that only relatively small regions there are illuminated by the field facet mirror 72.

Since the pupil surface 82 of the illumination system 20 is imaged onto the first pupil surface 34 of the projection objective 26 by the downstream optical components, an intensity distribution in which likewise only small regions are illuminated arises on the surface of the second mirror M2. Moreover, owing to the raster-like arrangement of the pupil facet mirrors 89, the regions are not illuminated homogeneously, but rather likewise rastered. The smaller the regions—often also designated as poles—on the surface of the second mirror M2, the less uniform the heat input arising as a result of the partial absorption of the projection light. Since around a third of the high-energy projection light is absorbed in the reflective coating of the mirrors, the heat input in the region of the rastered poles is relatively high. Even when using a mirror substrate consisting of a material having a low coefficient of thermal expansion, it is then difficult to avoid deformations of the mirror substrate. However, such deformations impair the imaging properties of the projection objective 26, such that the structures 12 on the mask 14 are no longer optimally imaged onto the light-sensitive layer 16.

2. Heating Light

In order to obtain a desired (generally homogeneous) temperature distribution on the surface of the mirror M2, the projection objective 26 contains a heating light source 100, which is designed for generating heating light HL, to which the layer 16 on the wafer 18 is not light-sensitive and that is at least partly absorbed by the mirror M2. An illumination optical unit 102 directs the heating light HL preferably only onto those regions of the reflective surface of the second mirror M2 which are not subjected to the high-energy EUV light.

Figure 4:
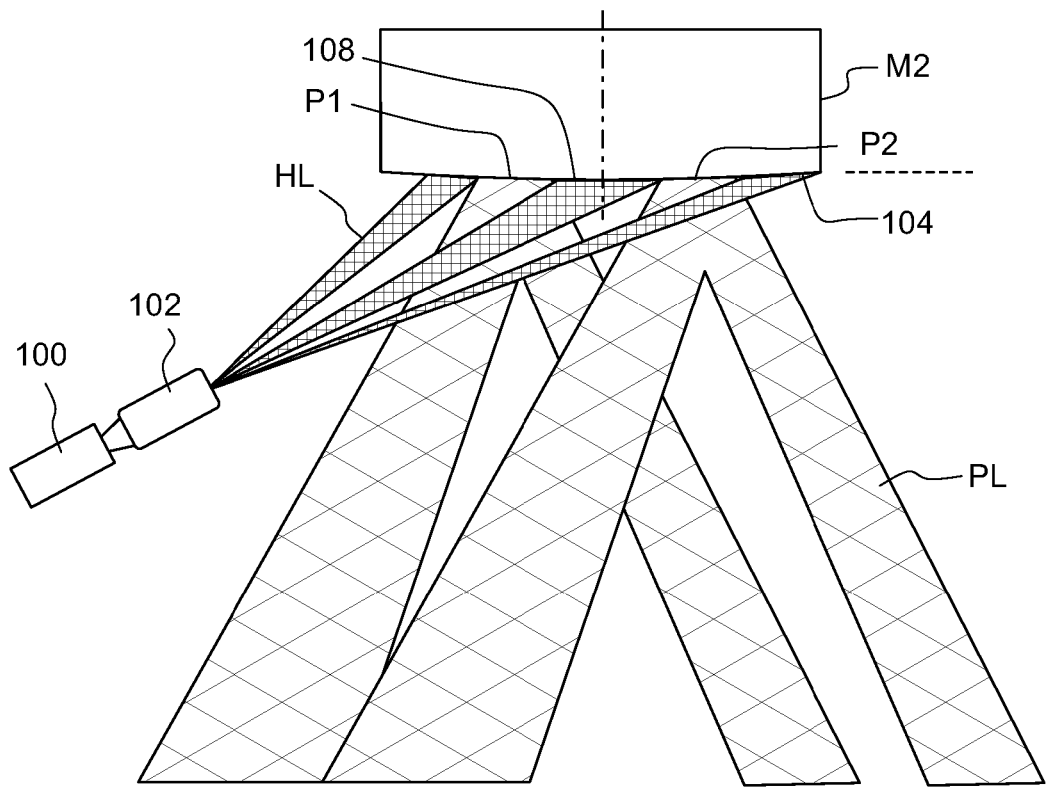
FIG. 4 is an enlarged excerpt from the meridional section in FIG. 2, which shows a mirror of a projection objective of the projection exposure apparatus, projection light and heating light impinging on the mirror.

FIG. 4 shows the second mirror M2, the heating light source 100 and the illumination optical unit 102 in an enlarged illustration in a meridional section. The projection light PL illuminates two comparatively small poles P1, P2 in rastered fashion on that mirror surface of the second mirror M2 which is designated by 104. The size and form of the two rastered poles P1, P2 and the position thereof on the mirror surface 104 of the mirror M2 are readily discernible in the plan view of the mirror M2 in accordance with FIG. 5.

In this embodiment, the illumination optical unit 102 is designed such that the heating light HL generated by the heating light source 100 is directed only onto regions 108 of the mirror surface 104 which are not subjected to projection light PL. As shown in the plan view in FIG. 5, in the embodiment illustrated, the region 108 illuminated by heating light HL is substantially circular and surrounds the two likewise approximately circular poles P1, P2.

If the heat input as a result of the absorption of the heating light HL is approximately of the same magnitude as that as a result of the absorption of the projection light PL in the region of the poles P1, P2, then the temperature distribution in the mirror M2 remains at least approximately rotationally symmetrical, even though the projection light PL illuminates only the two small poles P1, P2. If the average temperature of this temperature distribution is coordinated with the material of the mirror substrate such that the material has a minimal or even vanishingly small coefficient of thermal expansion at the temperature, then the second mirror M2 deforms not at all or slightly at most. However, any deformation possibly still occurring is then in any case itself once again rotationally symmetrical, which leads to rotationally symmetrical imaging aberrations that are comparatively easy to correct.

The temperature distribution established under the influence of the heating light HL in the second mirror M2 need not necessarily be rotationally symmetrical, however. As an alternative thereto, an appropriate option is to generate a temperature distribution which is arbitrary within certain limits but is predefined. This defined temperature distribution is taken into account in the design of the projection objective 26 such that no imaging aberrations are established in the case of the temperature distribution. The region 108 illuminated by the heating light HL on the mirror M2 then has to be adapted to the set illumination angle distribution—and thus to the geometry of the regions illuminated by the projection light PL on the mirror surface 104—such that the predefined temperature distribution is established in the second mirror M2 under all operating conditions.

Various configurations according to the disclosure for the illumination optical unit 102 are described below with reference to FIGS. 6 to 15.

Figure 6:
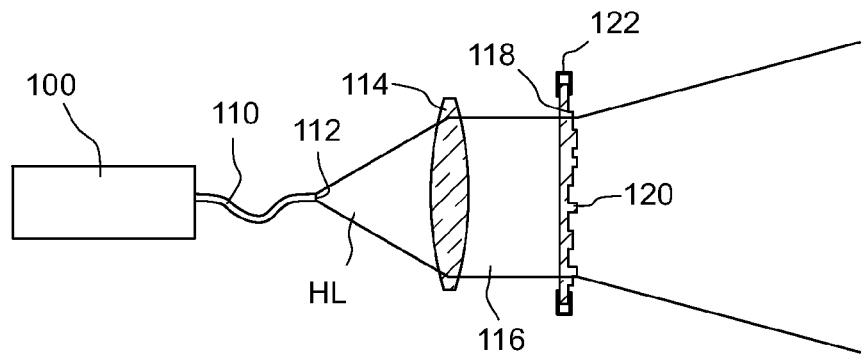
FIG. 6 is a simplified meridional section through an illumination optical unit provided for the heating light in accordance with a first embodiment, in which a deflection element is designed as a diffractive optical element.

In the embodiment shown in FIG. 6, the heating light source 100 generates infrared light having a centre wavelength of between 0.8 μm and 50 μm. The heating light HL is coupled into an optical fibre 110 and passes to an exit window 112 of the optical fibre 110 situated opposite the coupling-in side. The exit window 112 is situated in a focal plane of a collimator lens element 114, which generates a collimated heating light ray 116. The latter is incident on a deflection element 118, which is designed as a diffractive optical element in the embodiment illustrated. The diffractive optical element 118 contains a multiplicity of tiny diffractive structures 120, which are illustrated in an enlarged manner in FIG. 6 for the sake of clarity. Typically the size of the diffractive structures 120 is of the order of magnitude of a few micrometers.

The diffractive optical element is accommodated in an exchangeable holder 122, such that it can easily be exchanged for a diffractive optical element 118 having different optical deflection properties. The exchangeable holder 122, illustrated in a simplified manner here, can be embodied, for example, as a turret holder known per se, which includes a rotatably mounted disk including a plurality of diffractive optical elements 118 distributed over the circumference. By rotating the disk with the aid of a servomotor, it is then possible to introduce the desired diffractive optical element 118 into the beam path.

Figure 5:
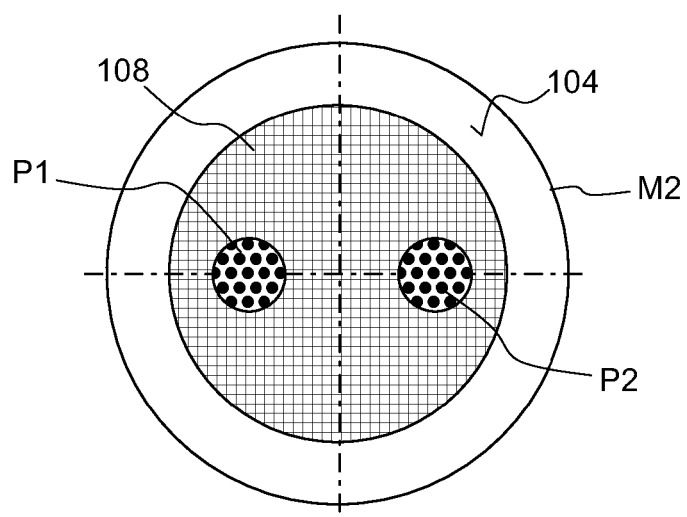
FIG. 5 is a plan view of the mirror shown in FIG. 4.

The structures 120 of the diffractive optical element 118 are designed such that the diffractive optical element 118 generates an angular distribution which leads in the far field to the desired intensity distribution of the heating light HL on the mirror surface 104, as is indicated by the illuminated region 108 in FIG. 5. The heating light HL generated by the heating light source 100 is thus distributed in a manner free of losses over the region 108 to be illuminated of the mirror surface 104.

If a different mask 14 is intended to be imaged, then the illumination angle distribution often also has to be adapted to the mask 14. This is manifested in the fact that the region illuminated by the projection light PL on the mirror surface 104 changes its form and/or size. Accordingly, the form of the region 108 illuminated by the heating light HL also has to be adapted in order to obtain the desired (generally rotationally symmetrical) temperature distribution in the second mirror M2. This adaptation is effected by changing the diffractive optical element 118 with the aid of the exchangeable holder 122.

Since the diffractive optical element 118 is subjected to the collimated heating light ray 116, inhomogeneities of the intensity distribution on the input side of the diffractive optical element 118, the input side being subjected to the collimated heating light ray 116, have no or no appreciable effect on the angular distribution generated by the diffractive optical element 118. As a result, the intensity distribution generated by the heating light HL on the mirror surface 104 is largely independent of manufacturing- or operating-dictated fluctuations of the intensity distribution on the diffractive optical element 118.

3. Alternative Embodiments

Figure 7:
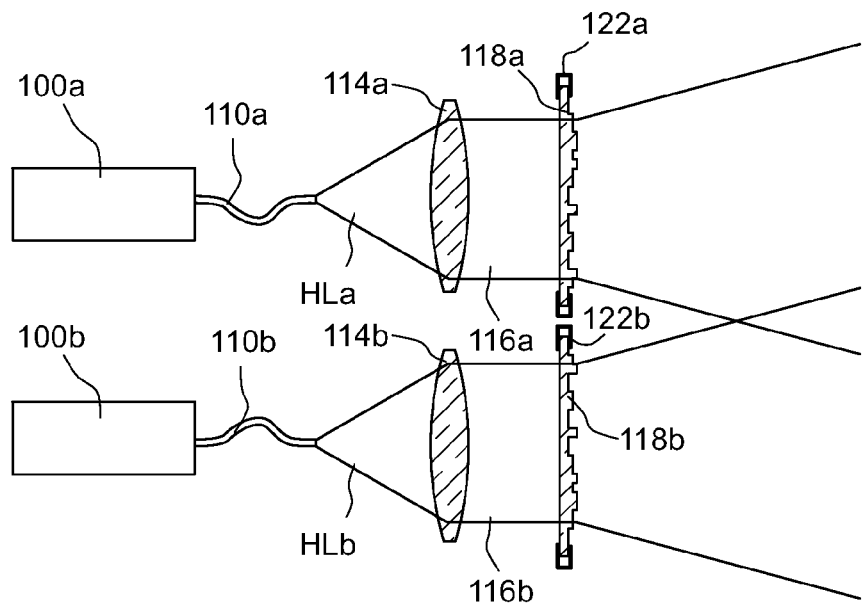
FIG. 7 is a simplified meridional section through an illumination optical unit provided for the heating light in accordance with a second embodiment, in which two separate heating light sources are provided.

In the embodiment shown in FIG. 7, two of the arrangements shown in FIG. 6 are used for illuminating the mirror surface 104 with heating light HLa, HLb. In this case, those components of the two arrangements which are identified by the additions a and b are designed identical with the exception of the diffractive elements 118a, 118b. By use of different diffractive optical elements 118a, 118b, different intensity distributions can be generated on the mirror surface 104, which intensity distributions can be superimposed arbitrarily via separate driving of the heating light sources 100a, 100b.

Figure 8:
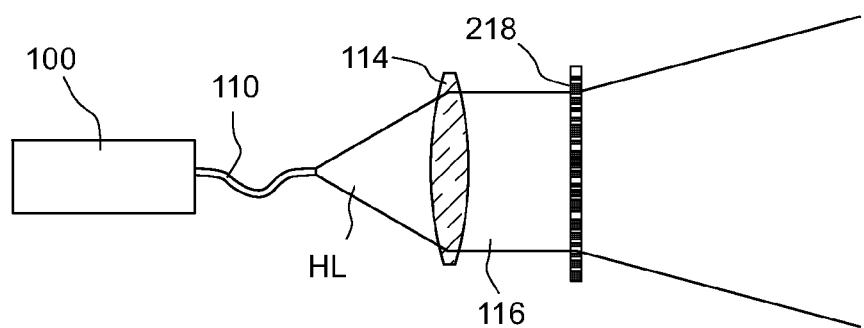
FIG. 8 is a simplified meridional section through an illumination optical unit provided for the heating light in accordance with a third embodiment, in which the diffractive optical element used as a deflection element is designed as an LCD panel.

In the embodiment shown in FIG. 8, the diffractive optical element is designed as an LCD panel 218 which is switchable in a spatially resolved manner. In this way, it is possible to generate different angular distributions without the diffractive optical element having to be exchanged for an element having different deflection properties, as in the embodiments shown in FIGS. 6 and 7.

Figure 9:
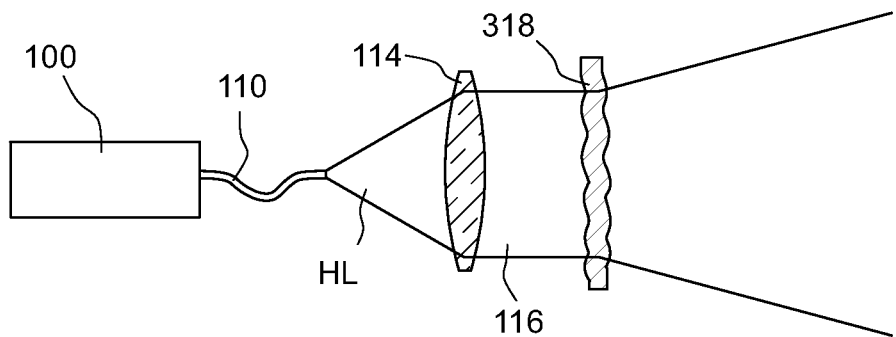
FIG. 9 is a simplified meridional section through an illumination optical unit provided for the heating light in accordance with a fourth embodiment, in which a deflection element is designed as an acousto-optical element.

In the embodiment shown in FIG. 9, the deflection element is an acousto-optical modulator 318, in which ultrasonic standing waves can be generated with the aid of an ultrasonic generator. This leads to the formation of a refractive index grating which has a diffractive effect and diffracts impinging light in different directions. The properties of the refractive index grating can be varied by varying the ultrasonic waves generated by the ultrasonic generator.

Figure 10:
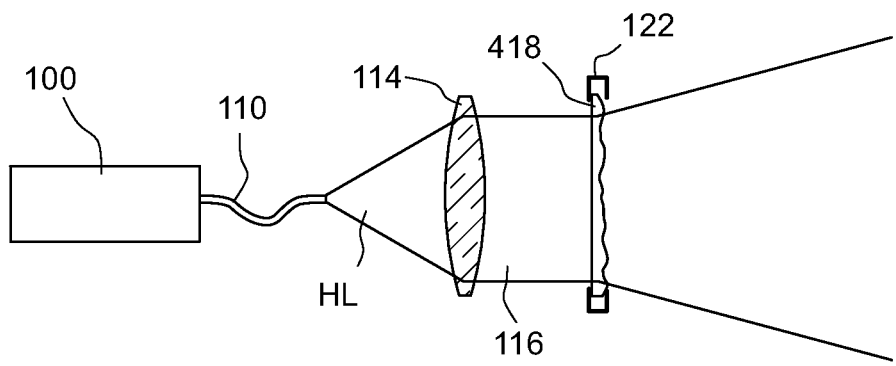
FIG. 10 is a simplified meridional section through an illumination optical unit provided for the heating light in accordance with a fifth embodiment, in which a deflection element is designed as a refractive freeform element.

In the embodiment shown in FIG. 10, the deflection element is embodied as a refractive freeform element 418. One or both refractive surfaces of the freeform element 418 subjected to the heating light HL have a surface profile defined such that the desired angular distribution of the heating light HL arises downstream of the freeform element 418.

Figure 11:
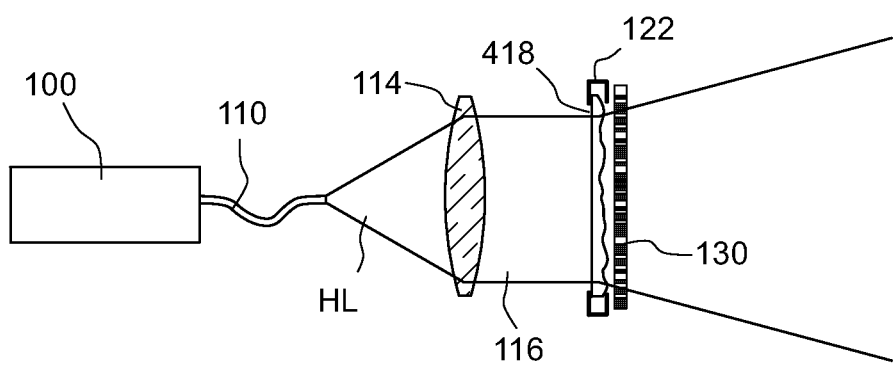
FIG. 11 is a simplified meridional section through an illumination optical unit provided for the heating light in accordance with a sixth embodiment, in which the freeform element is assigned an LCD panel as a controllable attenuator.

In order to be able to modify the angular distribution, in the embodiment shown in FIG. 11, an LCD panel 130 which is switchable in a spatially resolved manner is arranged in the beam path, which LCD panel, in contrast to the embodiment shown in FIG. 8, does not have diffractive properties, however, but rather is intended only to attenuate parts of the heating light in a controllably variable manner. The LCD panel 130 can therefore be arranged either upstream or downstream of the freeform element 418.

Figure 12:
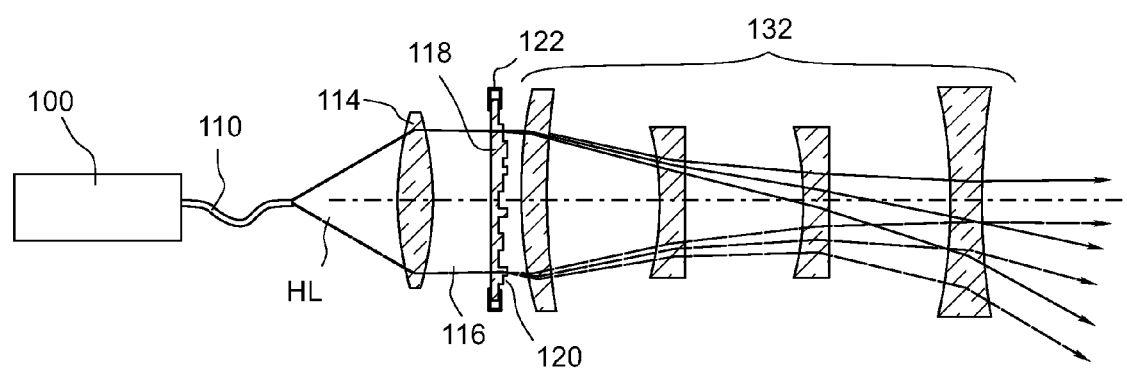
FIG. 12 is a simplified meridional section through an illumination optical unit provided for the heating light in accordance with a seventh embodiment, in which a telescopic optical unit is disposed downstream of the deflection element.

FIG. 12 shows a particularly preferred embodiment, wherein a magnifying telescope optical unit is arranged downstream of the diffractive optical element 118. Via the magnification, the angular distribution generated by the diffractive optical element 118 is additionally spread in order, in this way, to be able to illuminate even relatively large regions of the mirror surface 104 with heating light HL in a targeted manner. As a result of the spreading of the angular distribution, the demands made of the angular distribution to be generated by the diffractive optical element 118 are reduced, such that diffractive optical elements 118 having diffraction structures 120 which are larger and therefore easier to produce can be used.

4. Pivotable Heating Light Ray

Figure 13:
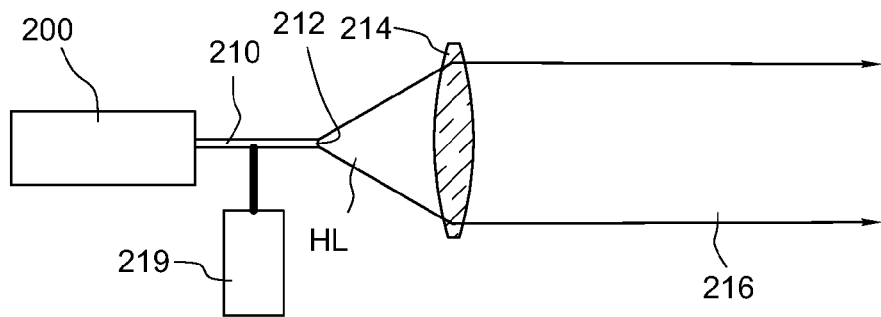
FIG. 13 is a simplified meridional section through an illumination optical unit provided for the heating light in accordance with an eighth embodiment, which is not part of the subject matter of the claimed disclosure.
Figure 14:
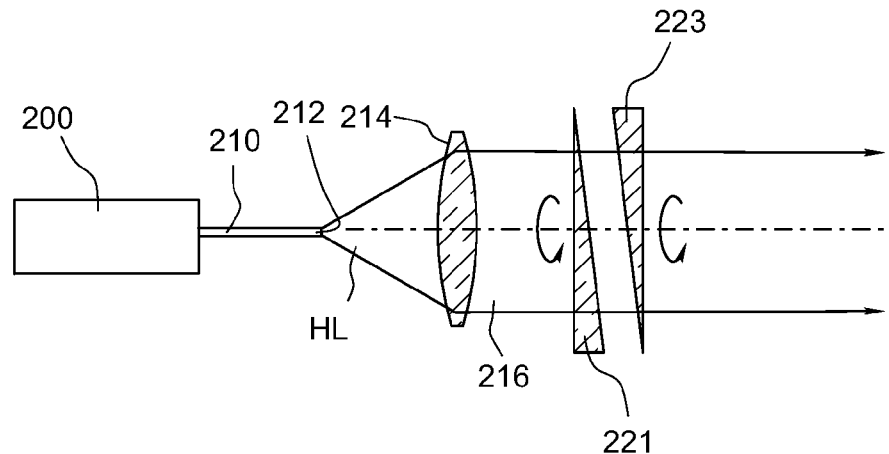
FIG. 14 is a simplified meridional section through an illumination optical unit provided for the heating light in accordance with a ninth embodiment, which is not part of the subject matter of the claimed disclosure.
Figure 15:
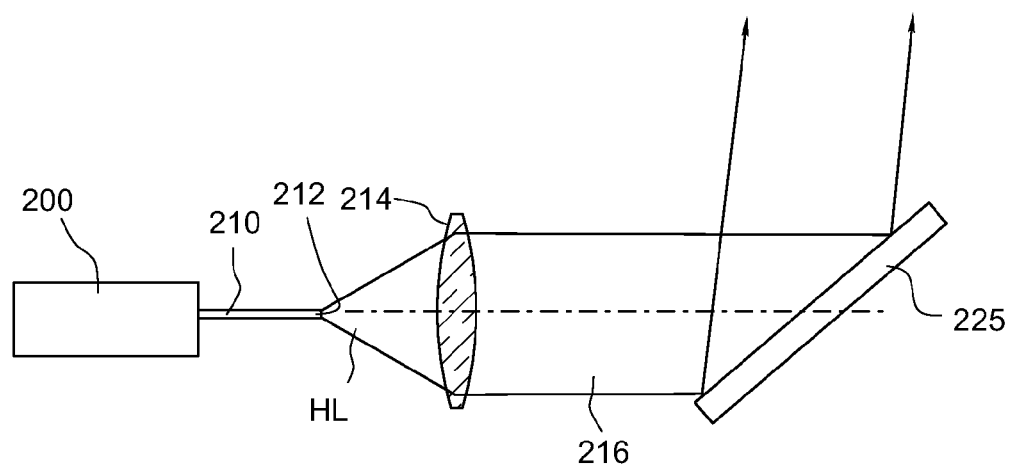
FIG. 15 is a simplified meridional section through an illumination optical unit provided for the heating light in accordance with a tenth embodiment, which is not part of the subject matter of the claimed disclosure.

FIGS. 13 to 15 show embodiments which are not part of the subject matter of the disclosure currently claimed.

Heating light generated by a heating light source 200 is coupled into an optical fibre 210 and emerges at an exit window 212 of the optical fibre 210. In this embodiment, too, a collimated heating light ray 216 arises downstream of a collimator lens 214. The heating light ray 216 has a diameter of the order of magnitude of a few centimeters, e.g. between 1 cm and 15 cm, and thus at a given point in time cannot illuminate the entire region 108 to be heated by the heating light on the mirror surface 104.

In order to be able to move the heating light ray 216 over the mirror surface 104, an actuator 219 is provided, which, in the embodiment illustrated, acts on the optical fibre 210 and thereby laterally deflects the exit window 212. Owing to the deflection, the propagation direction of the collimated heating light ray 216 is altered. It goes without saying that the actuator 219 can also act on the collimator lens 214. In order to enable the collimated heating light ray 216 to be pivoted in two dimensions, it is also possible to provide two or more actuators 219 which deflect the optical fibre 210 or the collimator lens 214 in different directions.

Appropriate actuators 219 include dynamic drives such as a plunger-type coil, piezoelectric drives, electrostatic drives or else thermal drives (e.g. bimetal elements).

The temperature distribution on the mirror surface 108 can be set either by changes of the intensity of the heating light HL generated by the heating light source 200, by changes of the distance or the speed of the pivoting movements of the heating light ray 216 or by a combination of both techniques. The smaller the focal length of the collimator lens 216, the larger in this case the pivoting movements in relation to the deflections produced by the actuator 219 with regard to the optical fibre 210 or the collimator lens 214.

In the embodiment shown in FIG. 14, the heating light ray 216 is deflected with the aid of two rotatable wedge prisms 221, 223. Depending on the angular positions of the wedge prisms 221, 223, the collimated heating light ray 216 is pivoted in different directions in two dimensions. In the case of uniform rotating wedge prisms 221, 223, a conical solid angle range is traversed by the heating light ray 216 on average over time. The intensity distribution on the mirror surface 108 can be varied by the synchronization of the wedge rotations with the light generation in the heating light source 200.

In the embodiment shown in FIG. 15, a polyaxially pivotable plane mirror 225 is introduced into the beam path of the collimated heating light ray 216 in order to be able to deflect the latter in different directions.

What is claimed is:

1. An apparatus configured to image a mask onto a layer, the apparatus comprising:
    a projection light source configured to generate projection light to which the layer is light-sensitive;
    an optical element having an optical surface subjected to the projection light during use of the apparatus;
    a heating light source configured to generate heating light to which the layer is not light-sensitive, the heating light source being different from the projection light source, the heating light being at least partly absorbed by the optical element during use of the apparatus;
    an illumination optical unit configured so that, during use of the apparatus, the illumination optical unit directs the heating light onto the optical element so that the heating light has a predetermined intensity on the optical surface,
    wherein:
        the illumination optical unit comprises a deflection element and a telescope optical unit downstream of the deflection element along a beam path;
        the deflection element comprises a diffractive optical element or a refractive freeform element;
        the deflection element is configured so that, at a given point in time during use of the apparatus, heating light impinging on the deflection element is directed by the deflection element into different directions; and
        the apparatus is a microlithographic projection exposure apparatus.

2. The apparatus of claim 1, further comprising an exchange holder accommodating the deflection element so that the deflection element is exchangeable with a different deflection element having different deflection properties.

3. The apparatus of claim 2, wherein the deflection element has controllably variable deflection properties.

4. The apparatus of claim 1, wherein the deflection element has controllably variable deflection properties.

5. The apparatus of claim 4, wherein the deflection element comprises a liquid crystal display panel which is switchable in a spatially resolved manner, the liquid crystal display panel being a diffractive optical element.

6. The apparatus of claim 5, wherein the deflection element comprises an acousto-optical modulator.

7. The apparatus of claim 5, wherein the illumination optical unit comprises a liquid crystal display panel which is switchable in a spatially resolved manner, and the liquid crystal display panel is configured to controllably attenuate portions of the heating light.

8. The apparatus of claim 1, wherein the optical element comprises a mirror, and the projection light has a wavelength of less than 30 nm.

9. The apparatus of claim 1, wherein the heating light is infrared light having a center wavelength between 0.8 μm and 50 μm.

10. The apparatus of claim 1, further comprising an exit window configured so that, during use of the apparatus, the heating light emerges from the exit window, wherein the illumination optical unit comprises a collimator configured to convert the heating light emerging from the exit window into a collimated beam.

11. The apparatus of claim 10, wherein the exit window is an end of an optical fiber configured to guide the heating light from the heating light source to the illumination optical unit.

12. The apparatus of claim 1, further comprising an exchange holder accommodating the deflection element so that the deflection element is exchangeable with a different deflection element having different deflection properties, wherein the deflection element has controllably variable deflection properties, the deflection element comprises a liquid crystal display panel which is switchable in a spatially resolved manner, the liquid crystal display panel being a diffractive optical element.

13. The apparatus of claim 12, wherein the deflection element comprises an acousto-optical modulator.

14. The apparatus of claim 12, wherein the illumination optical unit comprises a liquid crystal display panel which is switchable in a spatially resolved manner, and the liquid crystal display panel is configured to controllably attenuate portions of the heating light.

15. The apparatus of claim 12, wherein the illumination optical unit comprises a telescope optical unit downstream of the deflection element along a beam path.

16. The apparatus of claim 12, wherein the optical element comprises a mirror, and the projection light has a wavelength of less than 30 nm.

17. The apparatus of claim 12, wherein the heating light is infrared light having a center wavelength between 0.8 μm and 50 μm.

18. The apparatus of claim 12, further comprising an exit window configured so that, during use of the apparatus, the heating light emerges from the exit window, wherein the illumination optical unit comprises a collimator configured to convert the heating light emerging from the exit window into a collimated beam.

19. A method, comprising:
providing an apparatus according to claim 1;
using the apparatus to image the mask onto the layer using the projection light; and
simultaneously exposing the optical element to the heating light to heat the optical surface of the optical element.

* * * * *

UNITED STATES PATENT AND TRADEMARK OFFICE
CERTIFICATE OF CORRECTION

PATENT NO. : 9,052,606 B2
APPLICATION NO. : 13/627842
DATED : June 9, 2015
INVENTOR(S) : Andras G. Major et al.

Page 1 of 1

It is certified that error appears in the above-identified patent and that said Letters Patent is hereby corrected as shown below:

In the specification

Col. 4, line 47, delete "of the of the" and insert -- of the --.

Col. 6, line 54, delete "($\beta = 0$)," and insert -- ($\beta > 0$), --.

Signed and Sealed this
First Day of December, 2015

Michelle K. Lee
*Director of the United States Patent and Trademark Office*